(12) United States Patent
Agarwal et al.

(10) Patent No.: US 9,047,980 B2
(45) Date of Patent: Jun. 2, 2015

(54) SENSE AMPLIFIER FOR STATIC RANDOM ACCESS MEMORY WITH A PAIR OF COMPLEMENTARY DATA LINES ISOLATED FROM A CORRESPONDING PAIR OF COMPLEMENTARY BIT LINES

(75) Inventors: Pankaj Agarwal, Bangalore (IN); Shiju K. Kandiyil, Bangalore (IN); Krishnan S. Rengarajan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 79 days.

(21) Appl. No.: 13/563,960

(22) Filed: Aug. 1, 2012

(65) Prior Publication Data
US 2014/0036581 A1  Feb. 6, 2014

(51) Int. Cl.
G11C 7/06 (2006.01)
G11C 11/419 (2006.01)
G11C 7/12 (2006.01)

(52) U.S. Cl.
CPC .............. *G11C 11/419* (2013.01); *G11C 7/065* (2013.01); *G11C 7/12* (2013.01)

(58) Field of Classification Search
CPC ... G11C 11/419; G11C 11/417; G11C 11/413
USPC ............... 365/156, 154, 190, 205, 208, 207
See application file for complete search history.

(56) References Cited

U.S. PATENT DOCUMENTS

| 4,716,320 | A | 12/1987 | McAdams |
| 5,126,970 | A | 6/1992 | Ul Haq |
| 5,323,350 | A | 6/1994 | McLaury |
| 5,491,667 | A | 2/1996 | Sharp |
| 5,668,761 | A | 9/1997 | Muhich et al. |
| 5,729,501 | A | 3/1998 | Phillips et al. |
| 5,963,486 | A | 10/1999 | Yeung et al. |
| 6,034,909 | A | 3/2000 | Brady |
| 6,275,432 | B1 | 8/2001 | Hardee |
| 6,341,083 | B1 | 1/2002 | Wong |
| 6,798,688 | B2 | 9/2004 | Joshi |
| 7,061,793 | B2 | 6/2006 | Barth, Jr. et al. |
| 7,184,343 | B2 | 2/2007 | Kamata |

(Continued)

FOREIGN PATENT DOCUMENTS

JP    4593707 B2   12/2010

OTHER PUBLICATIONS

IBM, "Bit switch in semiconductor memory," An IP.com Prior Art Database Technical Disclosure, IP.com Number: IPCOM000013777D, Jun. 18, 2003, 6 pages.

(Continued)

*Primary Examiner* — Andrew Q Tran
(74) *Attorney, Agent, or Firm* — David A. Cain; Hoffman Warnick LLC

(57) ABSTRACT

A sense amplifier for a static random access memory (SRAM) is described. In one embodiment, a first pass gate transistor is driven by a bit line true associated with an SRAM cell. A second pass gate transistor is driven by a bit line complement associated with the SRAM cell. A first pull down transistor is coupled to the first pass gate transistor and a second pull down transistor is coupled to the second pass gate transistor. A data line true is coupled to a node coupling the first pull down transistor with the first pass gate transistor. A data line complement is coupled to a node coupling the second pull down transistor with the second pass gate transistor.

23 Claims, 5 Drawing Sheets

(56) References Cited

U.S. PATENT DOCUMENTS

| | | | |
|---|---|---|---|
| 7,522,462 B2 * | 4/2009 | Edahiro et al. | 365/205 |
| 7,656,723 B2 | 2/2010 | Kim et al. | |
| 7,679,948 B2 | 3/2010 | Park et al. | |
| 7,724,565 B2 | 5/2010 | Barth, Jr. et al. | |
| 7,724,586 B2 | 5/2010 | Adams et al. | |
| 7,768,854 B2 | 8/2010 | Chiu et al. | |
| 7,782,695 B2 | 8/2010 | Bedarida et al. | |
| 7,898,887 B2 | 3/2011 | Dudeck et al. | |
| 8,045,391 B2 | 10/2011 | Mokhlesi | |
| 8,144,537 B2 * | 3/2012 | Mishra et al. | 365/203 |
| 8,223,573 B2 * | 7/2012 | Koeppe et al. | 365/210.13 |
| 8,315,113 B2 * | 11/2012 | Yoon | 365/189.14 |
| 8,462,573 B2 | 6/2013 | Choi | |
| 2011/0211401 A1 | 9/2011 | Chan et al. | |

OTHER PUBLICATIONS

Qullette, et al. "Output Interface Circuitry for Dual-Port Static Random Access Memory that Employs a Clocked Latch-Type Sense Amplifier," An IP.com Prior Art Database Technical Disclosure, TBD v38 n7 Jul. 1995 p. 375-376, IP.com No. IPCOM000115993D, Mar. 30, 2005.

Qazi et al., A 512kb 8T SRAM Macro Operating Down to 0.57 V with an AC-Coupled Sense Amplifier and Embedded Data-Retention-Voltage Sensor in 45 nm SOI CMOS, 2011, pp. 85-96, IEEE Journal of Solid-State Circuits, vol. 46, No. 1.

Pelella et al., "A 8Kb Domino Read SRAM with Hit Logic and Parity Checker," 2005, pp. 359-362, Proceedings of ESSCIRC.

Kanj et al., "Mixture Importance Sampling and its Application to the Analysis of SRAM Designs in the Presence of Rare Failure Events," 2006, pp. 69-72, DAC.

Wicht et al., Yield and Speed Optimization of a Latch-Type Voltage Sense Amplifier, 2004, pp. 1148-1158, IEEE Journal of Solid-State Circuits, vol. 39, No. 7.

Shakir et al., Integrated Read Assist—Sense Amplifier Scheme for High Performance Embedded SRAMs, 2010, pp. 137-140, IEEE.

Rengarajan et al., "A Novel Sense Amp Circuits for SRAMs," 2009, 8 pages, Semiconductor Technology Symposium India Systems & Technology Lab.

* cited by examiner

SENSE AMPLIFIER FOR STATIC RANDOM ACCESS MEMORY WITH A PAIR OF COMPLEMENTARY DATA LINES ISOLATED FROM A CORRESPONDING PAIR OF COMPLEMENTARY BIT LINES

BACKGROUND

The present invention relates generally to integrated circuit (IC) memory devices, and more specifically, to a sense amplifier for a static random access memory (SRAM) device.

Contemporary memory access circuits rely on differential sense amplifiers to read small signals generated by a selected memory cell from a memory device such as an SRAM device. These sense amplifiers typically use transistors configured in a cross-coupled fashion to amplify a small voltage differential created by the cell. This cross-coupled configuration of the transistors is used to tolerate variation in device threshold by relying on device matching of the transistors as opposed to the absolute threshold voltages of the transistors. As semiconductor device technology continues to evolve towards providing smaller device sizes and more devices per IC (and thus smaller voltages utilized within the circuits within the IC), there is an increase in local device mismatch caused by random variation, including random dopant fluctuation and line edge roughness. One approach that has been used to reduce mismatch between transistors is by increasing the area of the cross-coupled devices. However, an increase in the area of the cross-coupled devices increases switching current and leakage. Higher leakage also degrades performance of the SRAM.

SUMMARY

In one embodiment, there is a circuit that comprises a first pass gate transistor driven by a bit line true associated with a static random access memory (SRAM) cell. The first pass gate transistor has a gate, a drain and a source. A second pass gate transistor is driven by a bit line complement associated with the SRAM cell. The first pass gate transistor has a gate, a drain and a source. A first pull down transistor is coupled to the first pass gate transistor. The first pull down transistor has a gate, a drain and a source. A second pull down transistor is coupled to the second pass gate transistor. The second pull down transistor has a gate, a drain and a source. A data line true is coupled to a node coupling the first pull down transistor with the first pass gate transistor, wherein the data line true is isolated from the bit line true by the first pass gate transistor. A data line complement is coupled to a node coupling the second pull down transistor with the second pass gate transistor, wherein the data line complement is isolated from the bit line complement by the second pass gate transistor.

In a second embodiment, there is a sense amplifier for a static random access memory (SRAM) cell. In this embodiment, the sense amplifier comprises a first pass gate transistor driven by a bit line true associated with the SRAM cell. A second pass gate transistor is driven by a bit line complement associated with the SRAM cell. A first pull down transistor is coupled to the first pass gate transistor and a second pull down transistor is coupled to the second pass gate transistor. A data line true is coupled to a node coupling the first pull down transistor with the first pass gate transistor, wherein the data line true is isolated from the bit line true by the first pass gate transistor. A data line complement is coupled to a node coupling the second pull down transistor with the second pass gate transistor, wherein the data line complement is isolated from the bit line complement by the second pass gate transistor.

In a third embodiment, there is a memory circuit. In this embodiment, the memory circuit comprises a memory array including a plurality of memory cells. At least one sense amplifier is connected to the memory array for selectively reading a logic state of at least one of the memory cells in the memory array. The at least one sense amplifier comprises a pair of inverter devices each controlled oppositely by a pair of complementary bit lines associated with the at least one of the memory cells in the memory array. The at least one sense amplifier further comprises a pair of complementary data lines each corresponding with one of the complementary bit lines. Each of the complementary data lines is coupled to one of the pair of inverter devices, wherein each of the complementary data lines is isolated from the corresponding bit line.

DETAILED DESCRIPTION

Figure 1:
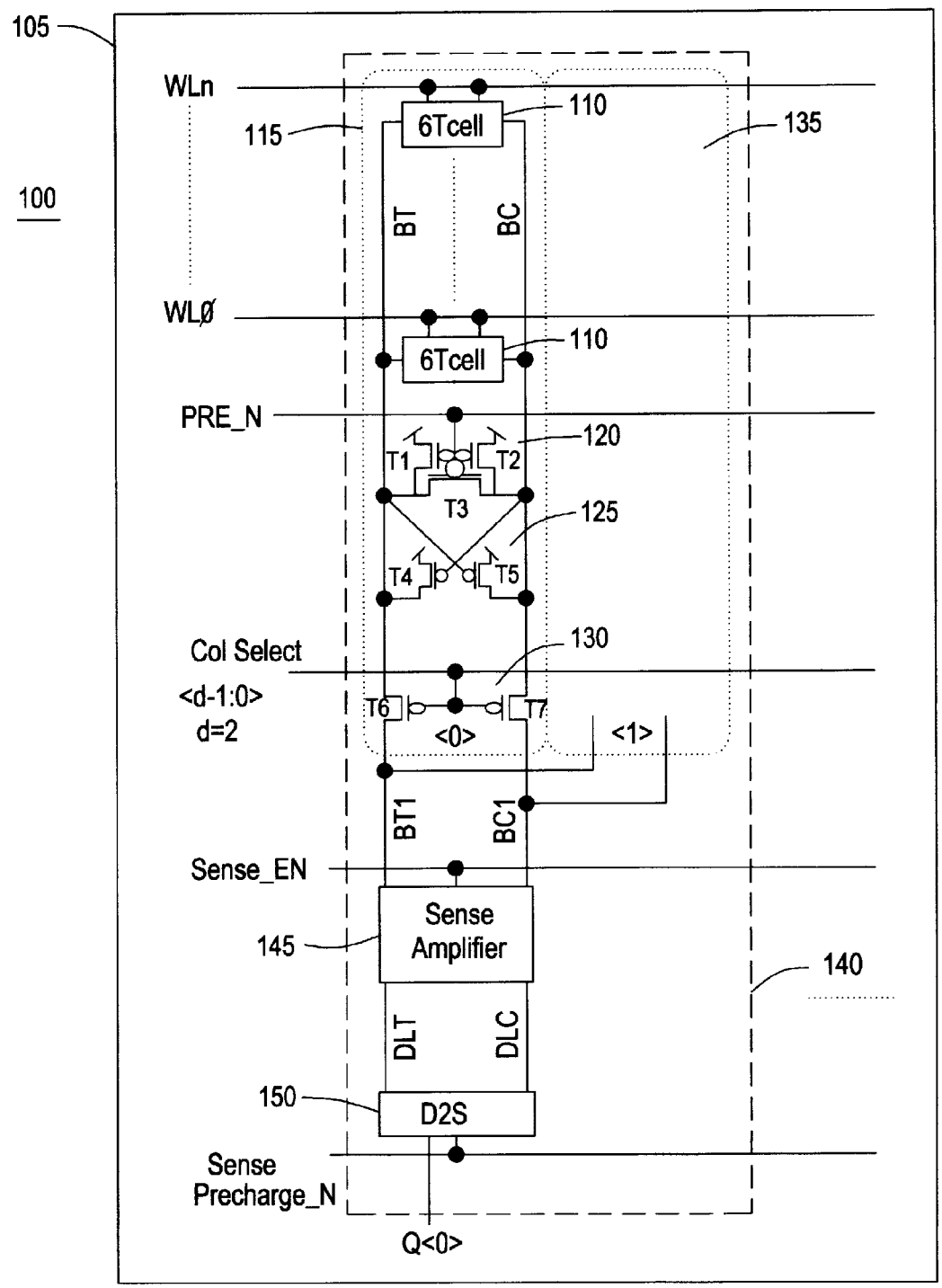
FIG. 1 shows a schematic of a memory circuit according to one embodiment of the present invention.

Referring to FIG. 1, there is a schematic of a memory circuit 100 according to one embodiment of the present invention. In particular, FIG. 1 shows a portion of a memory array 105 formed from memory cells 110 in which bits of data are stored. For ease of illustration, FIG. 1 shows only one column 115 of memory cells 110, however, memory array 105 would have a multiple of memory cells 110 arranged in each of its rows and columns. In one embodiment, memory array 105 can take the form of a static random access memory (SRAM). Although the description that follows for memory array 105 is directed to an SRAM, those skilled in the art will recognize that embodiments described below are also suited for use with other memory devices such as a dynamic RAM (DRAM).

Each SRAM cell 110 is capable of storing a binary voltage value that represents a logical data bit (e.g., "0" or "1"). One existing configuration for SRAM cell 110 can include a balanced pair of cross-coupled devices such as inverters that store a single data bit. The inverters act as a latch that stores the data bit therein, so long as power is supplied to memory array 105. A pair of pass gates (a balanced pair of field-effect transistors (FETs)) selectively connects the complementary outputs of the cross-coupled inverters to a corresponding complementary or differential pair of bit lines (i.e., bit line true (BT) and bit line complementary (BC)) that are used to write or read from cell 110 upon being put in a particular logic state. A word line (WL0 . . . WLn) connected to the gates of the pass gate FETs selects the cell 110 to the corresponding complementary pair of bit lines for performing an operation that may include a read or a write operation.

As an example, FIG. 1 shows that cell 110 can take the form of a six-transistor (6T) cell, wherein the pair of access transistors or pass gates (when activated by word line (WL0 . . . WLn) selectively couples the pair of cross-coupled inverters to the pair of complementary bit lines (i.e., a bit line true BT and bit line complementary BC). Those skilled in the art will appreciate that other SRAM cell designs using a different number of transistors (e.g., 4T, 8T, etc.) can be used for cell 110.

FIG. 1 further shows that memory array 105 further includes a cell precharge and equalization device 120 formed from P-type field effect transistors (PFET) T1, T2 and T3 and controlled by signal PRE_N. PFET T1 and PFET T2 form the precharge aspect of device 120, while PFET T3 forms the equalization aspect. Precharge devices PFET T1 and PFET T2 are used to charge bit line true BT and bit line complementary BC to a precharged level or a "ready" state to read data after initially being in a "stand-by" state waiting for a command. In one embodiment, precharge devices PFET T1 and PFET T2 charge bit line true BT and bit line complementary BC to "high". In another embodiment, precharge devices PFET T1 and PFET T2 can charge bit line true BT and bit line complementary BC to another level (e.g., between high and "low"). During the precharge operation, equalization device PFET T3 equalizes bit line true BT and bit line complementary BC in order to remove or cancel any offset that may exist between these bit lines.

After being precharged, the inverters of cell 110 are ready to read data along bit line true BT and bit line complementary BC. In particular, after being precharged, bit line true BT and bit line complementary BC are released from the voltage reference. When bit line true BT and bit line complementary BC are released from the precharged voltage level, then the inverters of cell 110 are connected to one of the bit lines upon a word line WL activating that particular cell. Once connected, there is a charge-sharing that occurs with the storage cell 110 and one of bit line true BT and bit line complementary BC via capacitors (not shown). A result of this charge sharing is that the charge in cell 110 and the charge in one of bit line true BT and bit line complementary BC will change, leaving a voltage differential with the other bit line not taking part in the charge sharing.

Memory array 105 further includes a pair of cross-coupled pull-ups 125 formed from PFETs T4 and T5 that keep the one bit line high while the other goes low. This facilitates a clear differential between bit line true BT and bit line complementary BC. As shown in FIG. 1, PFETs T4 and T5 are cross-coupled such that the gate of PFET T4 is coupled to bit line complementary BC, while the gate of PFET T5 is coupled to bit line true BT. In operation, if bit line true BT goes low then PFET T5 turns on, pulling bit line complementary BC high. Even though bit line complementary BC is already high because of the precharging, it is kept high by turning on PFET T5 and will not drift down due to the effects of noise.

Although not illustrated in FIG. 1, those skilled in the art will appreciate that memory array 105 would have N-type FETs (NFETs) coupled to bit line true BT and bit line complementary BC for facilitating writing operations. In addition, there would be other devices in memory array 105 to facilitate writing such as a write driver. For clarity in describing the various embodiments of the present invention these devices are not shown.

Memory array 105 further includes a pair of bit switch devices 130 formed from PFETs T6 and T7 that are used to select the particular column that cell 110 occupies in memory array 105. As shown in FIG. 1, column 115 is denoted as <0>, while another column 135 in a slice 140 of memory array 105 is denoted as <1>. Note that for clarity, column 135 is empty but it would be a mirror of column 115. In operation, columns 115 and 135 denoted by <0> and <1>, respectively, would be selected by the Col Select signal. In particular, the Col Select signal selects bit switch devices 130 formed from PFETs T6 and T7 in order to connect bit line true BT and bit line complementary BC to nodes containing corresponding bit lines, bit line true BT1 and bit line complementary BC1, respectively.

Bit line true BT1 and bit line complementary BC1 connect to sense amplifier 145 which amplifies the voltage differential on the bit lines. As shown in FIG. 1, sense amplifier 145 is controlled by a Sense_En signal. In operation, when enough of a signal has been developed on line true BT and bit line complementary BC, sense amplifier 145 is turned on by the Sense_En signal. The signal on line true BT and bit line complementary BC is then transferred to bit line true BT1 and bit line complementary BC1, and supplied to sense amplifier 145 for amplification. Sense amplifier 145 outputs the amplified voltage differential along a pair of complementary data lines (data line true DLT and data line complementary DLC) each corresponding respectively with one of the complementary bit lines (line true BT1 and bit line complementary BC1). Details of sense amplifier 145 are described below with respect to FIG. 2.

A differential to single ended signal (D2S) converter 150, controlled by Sense Precharge_N, receives the amplified voltage differential from sense amplifier 145 from data line true DLT and data line complementary DLC. D2S converter 150 converts the voltage differential to a single ended signal denoted in FIG. 1 as Q<0>. In one embodiment, when data line true DLT is high and data line complementary DLC is low, D2S converter 150 will generate a single Q<0> that is high corresponding to DLT being high. Conversely, when data line true DLT is low and data line complementary DLC is high, D2S converter 150 will generate a single Q<0> that is low corresponding to DLT being low. Basically, the output of single Q<0> is a function of the logical state of the input at data line true DLT and data line complement DLC. Details of D2S converter 150 are described below with respect to FIG. 3.

Figure 2:
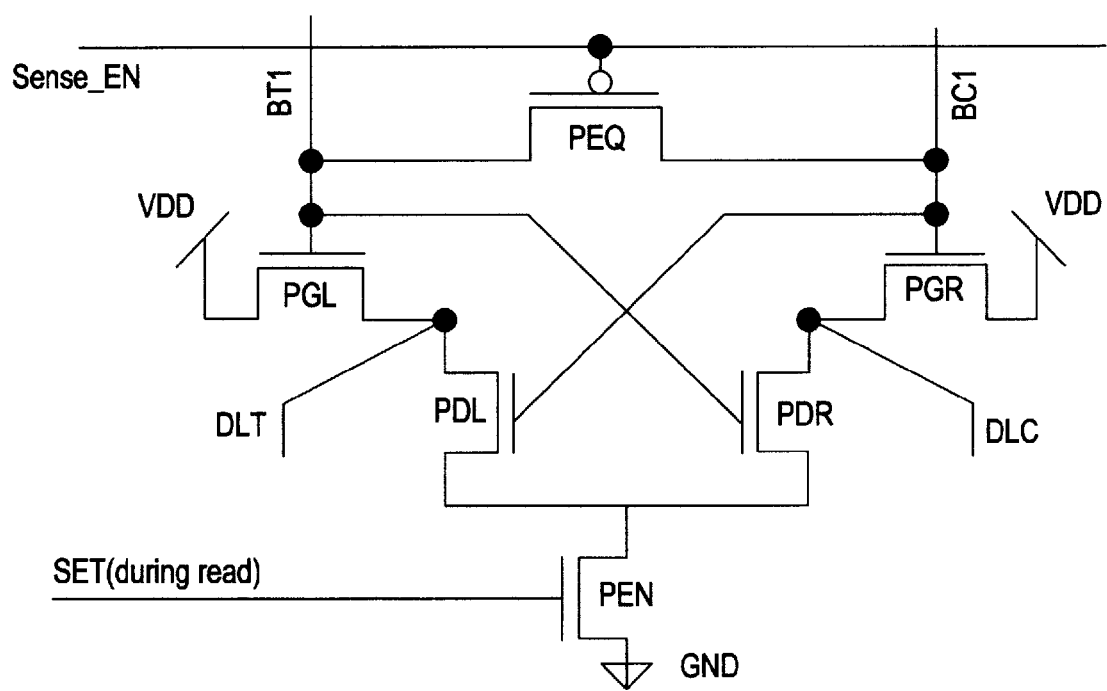
FIG. 2 shows a more detailed schematic view of a sense amplifier depicted in FIG. 1 according to one embodiment of the present invention.

FIG. 2 shows a more detailed schematic view of sense amplifier 145. As shown in FIG. 2, sense amplifier 145 includes a first pass gate transistor PGL (an N-type FET (NFET)) driven by bit line true BT1 and a second pass gate transistor PGR (an NFET) driven by a bit line complement BC1. In particular, bit line true BT1 is coupled to a gate of first pass gate transistor PGL and bit line complement BC1 is coupled to a gate of second pass gate transistor PGR. Sense amplifier 145 further includes a first pull down transistor PDL (an NFET) that is coupled to the first pass gate transistor PGL and a second pull down transistor PDR (an NFET) that is coupled to the second pass gate transistor PGR. A drain of first pass gate transistor PGL and a drain of second pass gate transistor PGR are coupled to a supply voltage VDD. Data line true DLT is coupled to a node that couples the first pull down transistor PDL with a source of first pass gate transistor PGL, and data line complement DLC is coupled to a node that couples the second pull down transistor PDR with a source of second pass gate transistor PGR. In this manner, data line true DLT is isolated from the bit line true BT1 by the first pass gate transistor PGL, while data line complement DLC is isolated from bit line complement BC1 by the second pass gate transistor PGR. FIG. 2 further shows that a gate of first pull down transistor PDL is driven by bit line complement BC1 and a gate of second pull down transistor PDR is driven by bit line true BT1. In this manner, a cross-coupled configuration is formed from driving the gate of first pull down transistor PDL with bit line complement BC1 and driving the gate of second pull down transistor PDR with bit line true BT1.

In one embodiment, first pass gate transistor PGL and first pull down transistor PDL, and second pass gate transistor PGR and second pull down transistor PDR form a pair of inverter devices (PGL and PDL; and PGR and PDR) each controlled oppositely by a pair of complementary bit lines (bit line true BT1 and bit line complement BC1). In order to reduce mismatches, the various embodiments of the present invention may use floating body devices for the pair of inverter devices (PGL and PDL; and PGR and PDR). Although a floating body device can suffer from history effects, the implementation of the various embodiments of the present invention provides isolation of data line true DLT and data line complement DLC from bit line true BT1 and bit line complement BC1, respectively, to provide gains from common mode issues, and facilitate a yield of memories having less mismatch. Furthermore, the isolation of bit line true BT and bit line complement BC, as well as bit line true BT1 and bit line complement BC1, from downstream circuits reduces noise effects due to leakage paths, giving a good signal on the bit lines. It is further noted that this isolation also reduces the load on the bit lines.

Referring back to FIG. 2, sense amplifier 145 further includes an equalization device formed from PFET transistor PEQ that serves to equalize bit line true BT1 and bit line complement BC1 into a steady state. In one embodiment, equalization device PEQ at the direction of the Sense_En signal can equalize bit line true BT1 and bit line complement BC1 upon completing a read operation when bit switch 130 (FIGS. 1—T6 and T7) disconnects the bit lines. Equalizing bit line true BT1 and bit line complement BC1 upon completing a read operation in combination with any precharge of bit lines BT and BC ensures that the lines are at a suitable operating point with no offset therebetween (equalization device PEQ is off during the read cycle). Otherwise, improper equalization of bit line true BT1 and bit line complement BC1 and precharging of bit lines BT and BC may lead to mismatch issues when a read cycle starts.

Sense amplifier 145 further includes a set device formed from NFET PEN that serves to set first pull down transistor PDL and second pull down transistor PDR to operate in an amplification state. Set device PEN is controlled by a SET signal during a read operation. In this manner, when the SET signal turns on set device PEN, only one of first pull down transistor PDL and second pull down transistor PDR, which are being driven by bit line complement BC1 and bit line true BT1, respectively, will be on. In particular, when bit line true BT1 goes low and bit line complement BC1 goes high during a read operation, second pull down transistor PDR goes off while first pull down transistor PDL turns on. This enables first pull down transistor PDL to pull down data line true DLT to correspond with bit line true BT1 going low, and second pull down transistor PDR to keep data line complement DLC high to correspond with bit line complement BC1 being high.

In this scenario, second pass gate transistor PGR keeps data line complement DLC clamped to not go below a certain voltage level. Thus, when SET signal turns on SET device PEN, any common mode signal that will arise in the inverter devices is obviated due to second pass gate transistor PGR keeping data line complement DLC from going to low during this common mode. Essentially, first pass gate transistor PGL and second pass gate transistor PGR weaken first pull down transistor PDL and second pull down transistor PDR, respectively, in order to maintain data line complement DLC high and data line true DLT low. In this manner, data line complement DLC and data line true DLT are isolated from bit line complement BC1 and bit line true BT1. This can aid in obviating common mode issues by allowing one of the data lines to not go below a certain voltage level during development of a signal.

Figure 3:
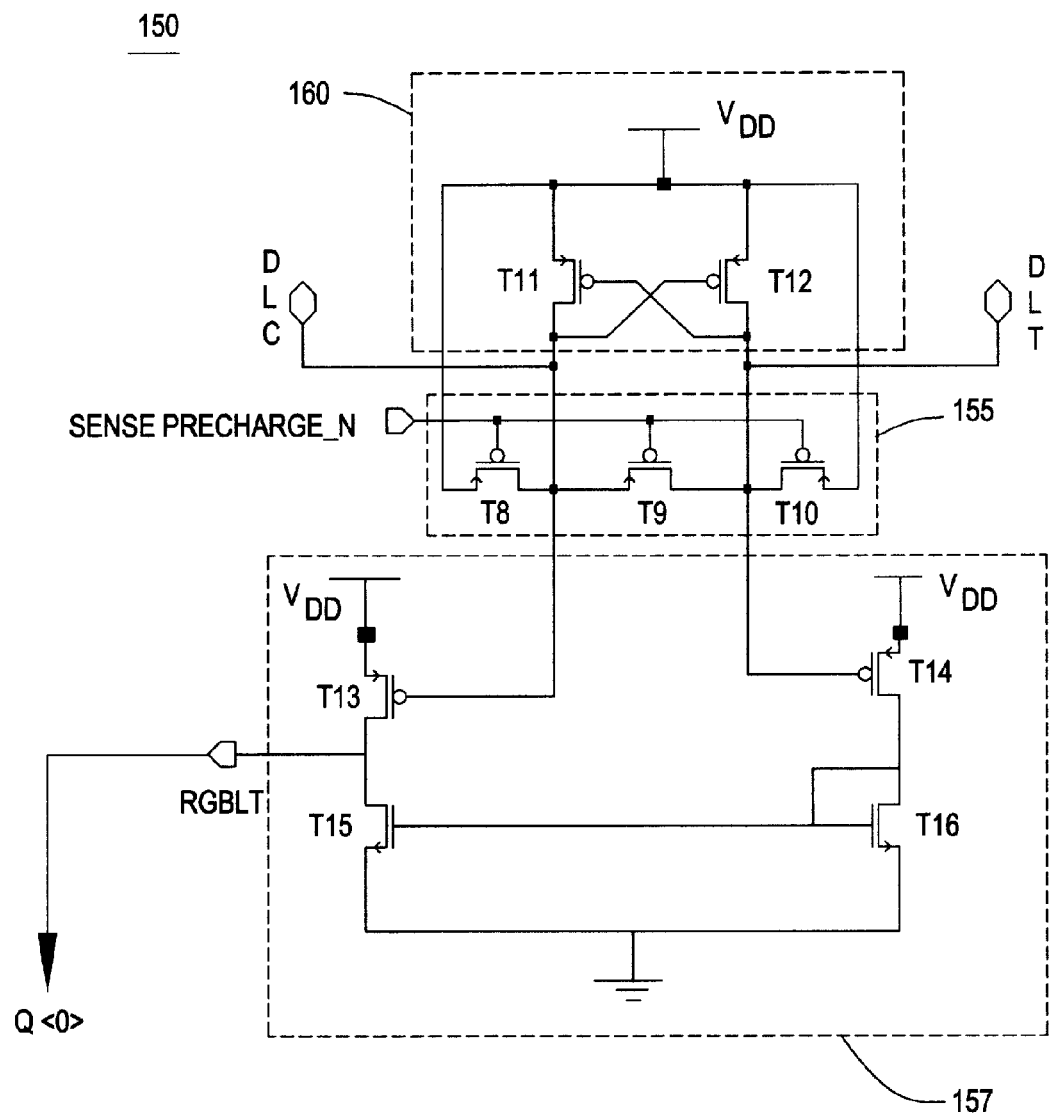
FIG. 3 shows a more detailed schematic view of a differential to single ended signal (D2S) converter depicted in FIG. 1 according to one embodiment of the present invention.

FIG. 3 shows a more detailed schematic view of D2S converter 150 depicted in FIG. 1 according to one embodiment of the present invention. As shown in FIG. 3, data line precharge device 155 controlled by Sense Precharge_N signal serves to precharge and equalize data line true DLT and data line complement DLC. Data line precharge device 155 includes PFETs T8, T9, and T10 connected in series with their gates driven by the Sense Precharge_N signal, and the drains of T8 and T10 coupled along a node that connect to data line complement DLC and data line true DLT, respectively.

Generally, the precharge and equalization of data line true DLT and data line complement DLC occurs before a read cycle is initiated. Once a read cycle is initiated, data line true DLT and data line complement DLC is released from the precharge and equalization operation. Once a word line turns on a particular cell, the complementary pair of bit lines will start to develop a signal in the manner described above (i.e., one of the bit lines (e.g., bit line true) goes low while the other bit line (i.e., bit line complement) will stay high). At an appropriate time (e.g., when enough of a signal has developed on the bit lines), sense amplifier 145 will turn on and amplify the signal on the bit lines, resulting in larger differential placed on data line true DLT and data line complement DLC.

A pair of cross-coupled transistors 160 is coupled to nodes connecting with data line true DLT and data line complement DLC. As shown in FIG. 3, pair of cross-coupled transistors 160 includes PFETs T11 and T12 with their gates cross-coupled with the drains of the opposing transistors. In particular, the drain of PFET T12 is coupled to the gate of PFET T11, while the drain of PFET T11 is coupled to the gate of PFET T12. Data line complement DLC and data line true DLT are connected along the nodes that couple the drains of PFETs T11 and T12, respectively. The sources of PFETs T11 and T12 connect to supply voltage VDD. Generally, cross-coupled transistors 160 on data line complement DLC and data line true DLT aid in keeping the high-side of the data lines high, turning on only after initial amplification. In addition, cross-coupled transistors 160 work in conjunction with data line precharge device 155 to facilitate the precharging of data line complement DLC and data line true DLT.

Although data line precharge device 155 and cross-coupled transistors 160 are shown as part of D2S converter 150, these devices could equally be shown in FIG. 2 as part of sense amplifier 145. In this manner, data line precharge device 155 and cross-coupled transistors 160 would be configured in the sense amplifier 145 of FIG. 2.

Note that in FIG. 3, data line complement DLC and data line true DLT are disclosed on a side that is opposite the sides of the data line pairs illustrated in FIGS. 1 and 2. This difference is for clarity in explaining the various embodiments of the present invention, and those skilled in the art will appreciate that data line complement DLC and data line true DLT can be configured on either side.

Referring back to FIG. 3, D2S converter 150 can be implemented to include PFETs T13 and T14 and NFETs T15 and T16 (collectively 157). In this manner, when data lines are amplified such that data complement DLC is in a low state and data line true DLT is in a high state, PFET T13 will turn on and PFET T14 will be off. PFET T13 being on results in the RGBLT signal (which is outputted as Q<0>) being pulled high. PFET T14 being off results in NFET T16 being pulled low because of the diode connection formed by connecting the gate of NFET T16 to its drain. Since NFET T15 is fed by the diode-connected NFET T16, it too will be off, facilitating the RGBLT signal being pulled high. When data complement DLC is in a high state and data line true DLT is in a low state, PFET T13 will turn off and PFET T14 will be on. PFET T13 being off results in the RGBLT signal being pulled low. PFET T14 being on results in NFET T16 being pulled high because of the diode connection formed by connecting the gate of NFET T16 to its drain. Since NFET T15 is fed by the diode-connected NFET T16, it too will be on, facilitating the RGBLT signal being pulled low.

As noted above, the output Q<0> generated from D2S converter 150 is a function of the polarity or state on data line true DLT and data complement DLC. For example, if data complement DLC is low and data line true DLT is high, then the RGBLT signal is high. On the other hand, if data complement DLC is high and data line true DLT is low, then the RGBLT signal is low.

Figure 4:
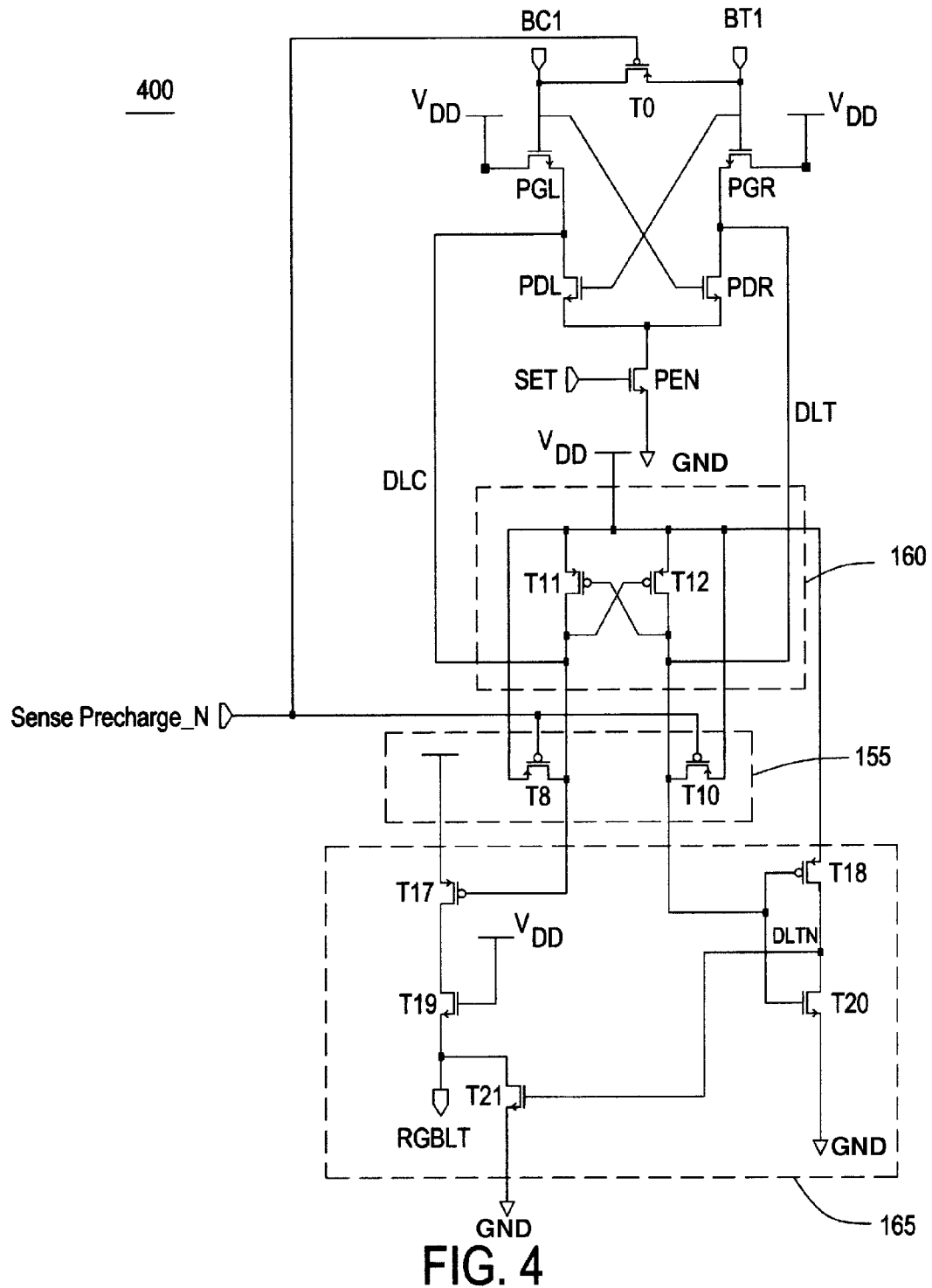
FIG. 4 is a circuit layout showing the sense amplifier depicted in FIG. 1 and the D2S converter depicted in FIG. 3 according to one embodiment of the present invention.

D2S converter 150 shown in FIG. 3 is only an example of one possible D2S converter. Those skilled in the art will appreciate that there are other designs of a D2S converter that could be used with sense amplifier 145. Thus, D2S converter 150 is not meant to limit the scope of the various embodiments described herein. For example, FIG. 4 shows a circuit layout 400 showing devices that form sense amplifier 145 with a D2S converter 165 that differs from the one depicted in FIG. 3. In FIG. 4, D2S converter 165 includes PFETs T17 and T18 and NFETs T19, T20 and T21. D2S converter 165 in FIG. 4 operates differently than the D2S converter depicted in FIG. 3, however, both converters will perform the same function. That is, both D2S converters will generate an output that is a function of function of the polarity or state on data line true DLT and data complement DLC. For example, if data complement DLC is low and data line true DLT is high, then the RGBLT signal is high. On the other hand, if data complement DLC is high and data line true DLT is low, then the RGBLT signal is low.

Figure 5:
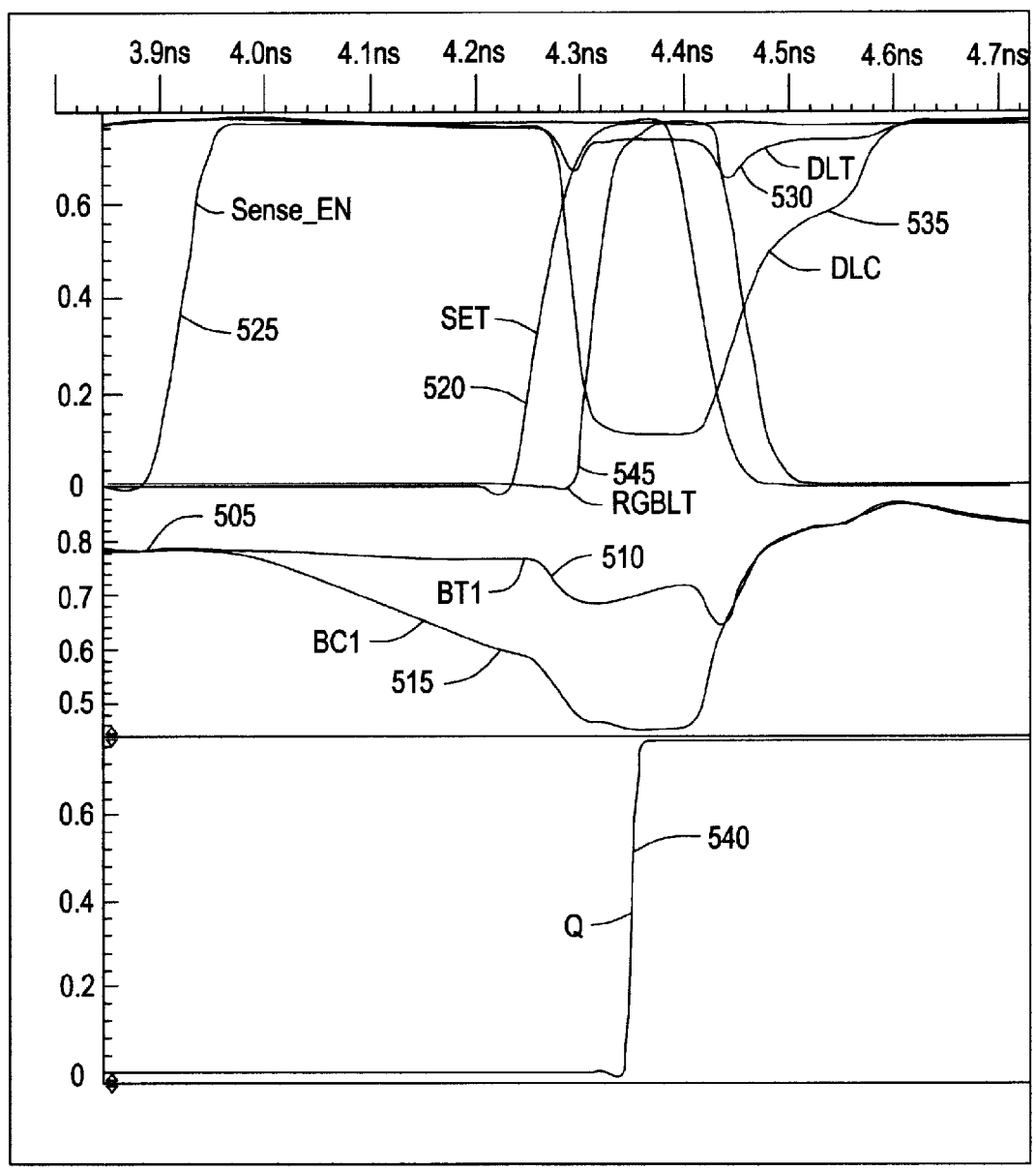
FIG. 5 shows a simulation of the operation of the sense amplifier depicted in FIG. 1 and the D2S converter depicted in FIG. 3 according to one embodiment of the present invention.

FIG. 5 shows a simulation 500 of the operation of sense amplifier 145 depicted in FIG. 1 and a D2S converter (150 or 165) depicted in FIGS. 3 and 4 according to one embodiment of the present invention. In simulation 500, line 505 represents bit line true BT1 and bit line complement BC1 prior to charge sharing taking place between the bit lines. Upon charge sharing, bit line true BT1 stays high as represented by line 510 while bit line complement BC1 goes low as represented by line 515. Note that bit line true BT1 decreases a little due to leakage. When the SET signal as represented by line 520 turns on (goes high), sense amplifier 145 turns on causing it to amplify the voltage differential between bit line true BT1 and bit line complement BC1. Note that during this amplification that bit line true BT1 dips a little due to common mode noise, however, the use of the devices in sense amplifier 145 keeps this bit line from going much lower. Furthermore, the ratio of the first pass gate transistor PGL to the series combination of the second pull down transistor PDL and PEN transistor is such that there can be sufficient amplification at the sense amp output. In one embodiment, it is best to maintain the ratio such that when the SET signal turns on, the high side of data line complement DLC and data line true DLT dips very little due to common mode As shown in FIG. 5, before charge sharing takes place between bit line true BT1 and bit line complement BC1, the Sense_En signal as represented by line 525 is initiated. This causes the D2S converter to turn on and precharge and equalize data line true DLT and data complement DLC as represented by lines 530 and 535, respectively. During the amplification, data line true DLT stays high while data complement DLC goes low. Generally, one of the data lines (DLC or DLT) is maintained at a relatively higher level because the same discharging bit line helps to weaken the pull down transistor (PDL or PDR) of the other side. Essentially, this results in a push-pull or OFF-ON relationship where there is a push to turn OFF a pass gate transistor (PGL and PGR) and pull down transistor (PDL and PDR) pair (one inverter of the sense amplifier), and a pull to turn ON the complement pass gate transistor/pull down transistor pair (the other inverter of the sense amplifier). This push-pull feature without a direct output/input feedback connection gives sense amplifier 145 a robustness against mismatch effects. This robustness allows sense amplifier 145 to deploy floating body devices as opposed to body contacted devices which are typically used with conventional amplifiers.

Once the amplification happens, the <Q> output signal as represented by line 540 starts to target the RGBLT signal as represented by line 545, and generate a single ended signal which is provided from the D2S converter. Note that the RGBLT signal goes high when data line true DLT and data complement DLC are amplified. Once the D2S converter generates the <Q> output signal, then the read cycle starts to finish up causing data line true DLT and data complement DLC and bit line true BT1 and bit line complement BC1 to converge where they are subsequently equalized to remove any offset. Note that sense amplifier 145 turns off as the SET signal transition to low.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A circuit, comprising:
   a first pass gate transistor driven by a bit line true associated with a static random access memory (SRAM) cell, the first pass gate transistor having a gate, a drain and a source;
   a second pass gate transistor driven by a bit line complement associated with the SRAM cell, the second pass gate transistor having a gate, a drain and a source;
   a first pull down transistor coupled to the first pass gate transistor, the first pull down transistor having a gate, a drain and a source;
   a second pull down transistor coupled to the second pass gate transistor, the second pull down transistor having a gate, a drain and a source;
   a data line true coupled to a first node coupling the first pull down transistor with the first pass gate transistor, wherein the data line true is isolated from the bit line true by the first pass gate transistor;
   a data line complement coupled to a second node coupling the second pull down transistor with the second pass gate transistor, wherein the data line complement is isolated from the bit line complement by the second pass gate transistor; and
   a differential to single ended signal converter that receives data from the data line true and the data line complement as input and generates a single output therefrom.

2. The circuit according to claim 1, wherein the gate of the first pass gate transistor is coupled to the bit line true and the gate of the second pass gate transistor is coupled to the bit line complement.

3. The circuit according to claim 1, wherein the source of the first pass gate transistor is coupled to the data line true and the source of the second pass gate transistor is coupled to the data line complement.

4. The circuit according to claim 1, wherein the first pass gate transistor, the second pass gate transistor, the first pull down transistor and the second pull down transistor are formed from floating body devices.

5. The circuit according to claim 1, wherein the gate of the first pull down transistor is driven by the bit line complement and the gate of the second pull down transistor is driven by the bit line true.

6. The circuit according to claim 5, wherein a cross-coupled configuration is formed from driving the gate of the first pull down transistor with the bit line complement and driving the gate of the second pull down transistor with the bit line true.

7. The circuit according to claim 1, wherein the first pass gate transistor and the second pass gate transistor are each configured to function as a clamp that keeps one of the data line true and the data line complement in a high logic state during an amplification of the bit line true and the bit line complement.

8. The circuit according to claim 1, further comprising a set device to set the first pull down transistor and the second pull down transistor to operate in an amplification state.

9. The circuit according to claim 1, further comprising an equalization device to equalize the bit line true and the bit line complement and the data line true and the data line complement.

10. The circuit according to claim 1, further comprising a precharge device to precharge the bit line true and the bit line complement and the data line true and the data line complement.

11. A sense amplifier for a static random access memory (SRAM) cell, comprising:
    a first pass gate transistor driven by a bit line true associated with the SRAM cell;
    a second pass gate transistor driven by a bit line complement associated with the SRAM cell;
    a first pull down transistor coupled to the first pass gate transistor;
    a second pull down transistor coupled to the second pass gate transistor;
    a data line true coupled to a first node coupling the first pull down transistor with the first pass gate transistor, wherein the data line true is isolated from the bit line true by the first pass gate transistor;
    a data line complement coupled to a second node coupling the second pull down transistor with the second pass gate transistor, wherein the data line complement is isolated from the bit line complement by the second pass gate transistor; and
    a differential to single ended signal converter that receives data from the data line true and the data line complement as input and generates a single output therefrom.

12. The sense amplifier according to claim 11, wherein a gate of the first pass gate transistor is coupled to the bit line true and a gate of the second pass gate transistor is coupled to the bit line complement.

13. The sense amplifier according to claim 11, wherein a source of the first pass gate transistor is coupled to the data line true and a source of the second pass gate transistor is coupled to the data line complement.

14. The sense amplifier according to claim 11, wherein a drain of the first pass gate transistor and the drain of the second pass gate transistor are coupled to a supply voltage.

15. The sense amplifier according to claim 11, wherein a gate of the first pull down transistor is driven by the bit line complement and a gate of the second pull down transistor is driven by the bit line true.

16. The sense amplifier according to claim 15, wherein a cross-coupled configuration is formed from driving the gate of the first pull down transistor with the bit line complement and driving the gate of the second pull down transistor with the bit line true.

17. The sense amplifier according to claim 11, further comprising a set device to set the first pull down transistor and the second pull down transistor to operate in an amplification state.

18. The sense amplifier according to claim 11, further comprising an equalization device to equalize the bit line true and the bit line complement.

19. The sense amplifier according to claim 11, further comprising a precharge device to precharge the bit line true and the bit line complement.

20. The sense amplifier according to claim 11, further comprising a pair of cross-coupled P-type field effect transistors (PFETs) each coupled to both the data line true and the data line complement.

21. A memory circuit, comprising:
    a memory array including a plurality of memory cells;
    at least one sense amplifier connected to the memory array for selectively reading a logic state of at least one of the memory cells in the memory array, the at least one sense amplifier comprising:
        a pair of inverter devices each controlled oppositely by a pair of complementary bit lines associated with the at least one of the memory cells in the memory array; and
        a pair of complementary data lines each corresponding with one of the complementary bit lines, each of the complementary data lines coupled to one of the pair of inverter devices, wherein each of the complementary data lines is isolated from the corresponding bit line; and
    at least one differential to single ended signal converter connected to the at least one sense amplifier that receives data from the pair of complementary data lines as input and generates a single output therefrom.

22. The memory circuit according to claim 21, further comprising:
    at least one pair of bit switch devices for connecting the pair of complementary bit lines associated with the at least one of the memory cells in the memory array with the at least one sense amplifier.

23. The memory circuit according to claim 21, wherein each inverter device comprises:
    a pass gate transistor driven by one of the complementary bit lines;
    a pull down transistor coupled to the pass gate transistor driven by the other complementary bit line;
    wherein one of the pair of complementary data lines is coupled to a node coupling the pull down transistor with the pass gate transistor, wherein the one of the pair of complementary data lines is isolated from the corresponding complementary bit line by the pass gate transistor.

* * * * *